(12) United States Patent
Aritome

(10) Patent No.: US 7,983,090 B2
(45) Date of Patent: *Jul. 19, 2011

(54) MEMORY VOLTAGE CYCLE ADJUSTMENT

(75) Inventor: Seiichi Aritome, Zhudong (TW)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/754,919

(22) Filed: Apr. 6, 2010

(65) Prior Publication Data

US 2010/0188904 A1 Jul. 29, 2010

Related U.S. Application Data

(60) Continuation of application No. 12/354,975, filed on Jan. 16, 2009, now Pat. No. 7,715,239, which is a division of application No. 11/414,966, filed on May 1, 2006, now Pat. No. 7,495,966.

(51) Int. Cl.
*G11C 16/06* (2006.01)

(52) U.S. Cl. .............. 365/185.22; 365/236; 365/185.18; 365/185.19

(58) Field of Classification Search .............. 365/185.22, 365/236, 185.03, 185.11, 185.18–185.19, 365/185.29
See application file for complete search history.

(56) References Cited

U.S. PATENT DOCUMENTS

| | | | |
|---|---|---|---|
| 6,252,803 B1 | 6/2001 | Fastow et al. | |
| 6,345,001 B1 | 2/2002 | Mokhlesi | |
| 6,643,187 B2 | 11/2003 | Mokhlesi | |
| 6,847,555 B2 | 1/2005 | Toda | |
| 6,907,497 B2 | 6/2005 | Hosono et al. | |
| 6,944,063 B2 | 9/2005 | Chen et al. | |
| 7,012,835 B2 | 3/2006 | Gonzalez et al. | |
| 7,020,017 B2 | 3/2006 | Chen et al. | |
| 7,110,300 B2 * | 9/2006 | Visconti | 365/185.22 |
| 7,149,110 B2 | 12/2006 | Tran et al. | |
| 7,209,390 B2 | 4/2007 | Lue et al. | |
| 7,301,817 B2 | 11/2007 | Li et al. | |
| 7,339,834 B2 | 3/2008 | Lutze | |
| 7,408,810 B2 | 8/2008 | Aritome | |
| 7,479,654 B2 | 1/2009 | Bertin et al. | |
| 7,495,966 B2 | 2/2009 | Aritome | |
| 7,715,239 B2 * | 5/2010 | Aritome | 365/185.22 |
| 2005/0219896 A1 | 10/2005 | Chen et al. | |
| 2007/0195603 A1 | 8/2007 | Aritome et al. | |
| 2007/0253256 A1 | 11/2007 | Aritome | |

OTHER PUBLICATIONS

United States Patent and Trademark Office Action for related U.S. Appl. No. 11/414,966 dated May 19, 2008 (17 pgs.).
Applicant's Amendment and Response dated Jun. 13, 2008 to Examiner's Office Action dated May 19, 2008 (25 pgs.).
United States Patent and Trademark Final Office Action for related U.S. Appl. No. 11/414,966 dated Sep. 5, 2008 (7 pgs.).
Applicant's Response dated Sep. 26, 2008 to Examiner's Final Office Action dated Sep. 5, 2008 (22 pgs.).

* cited by examiner

*Primary Examiner* — David Lam
(74) *Attorney, Agent, or Firm* — Brooks, Cameron & Huebsch, PLLC

(57) ABSTRACT

The present disclosure includes various method, device, system, and module embodiments for memory cycle voltage adjustment. One such method embodiment includes counting a number of process cycles performed on a first memory block in a memory device. This method embodiment also includes adjusting at least one program voltage, from an initial program voltage to an adjusted voltage, in response to the counted number of process cycles.

27 Claims, 7 Drawing Sheets

BEFORE CYCLING

AFTER CYCLING

MEMORY VOLTAGE CYCLE ADJUSTMENT

PRIORITY INFORMATION

This application is a Continuation of U.S. patent application Ser. No. 12/354,975 filed Jan. 16, 2009, now U.S. Pat. No. 7,715,239 issued May 11, 2010, which is a Divisional of U.S. patent application Ser. No. 11/414,966 filed May 1, 2006 now U.S. Pat. No. 7,495,966 issued Feb. 24, 2009 the specification of which is incorporated by reference herein.

TECHNICAL FIELD

The present disclosure relates generally to semiconductor devices and, more particularly, to memory devices having memory voltage cycle adjustment

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Two common types of flash memory array architectures are the "NAND" and "NOR" architectures, so called for the logical form in which the basic memory cell configuration of each is arranged. In the NOR array architecture, the floating gate memory cells of the memory array are typically arranged in a matrix.

The gates of each floating gate memory cell of the array matrix are typically coupled by rows to word select lines and their drains are coupled to column bit lines. The NOR architecture floating gate memory array is accessed by a row decoder activating a row of floating gate memory cells by selecting the word select line coupled to their gates. The row of selected memory cells then place their data values on the column bit lines by flowing different currents depending on if a particular cell is in a programmed state or an erased state.

A NAND array architecture also arranges its array of floating gate memory cells in a matrix such that the gates of each floating gate memory cell of the array are coupled by rows to word select lines. However each memory cell is not directly coupled to a column bit line by its drain. Instead, the memory cells of the array are coupled together in series, source to drain, between a source line and a column bit line.

The NAND architecture memory array is accessed by a row decoder activating a row of memory cells by selecting the word select line coupled to their gates. A high bias voltage is applied to a select gate drain line SG(D).

In addition, the word lines coupled to the gates of the unselected memory cells of each group are driven (e.g., at Vpass) to operate the unselected memory cells of each group as pass transistors so that they pass current in a manner that is unrestricted by their stored data values. Current then flows from the source line to the column bit line through each series coupled group, restricted only by the selected memory cells of each group. This places the current encoded data values of the row of selected memory cells on the column bit lines.

In some memory cells, the memory performance, e.g., programming speed, may increase as the number of program/erase cycles increases. However, this condition may make the affected cells more susceptible to over-programming. For instance, when a voltage is applied to the cell, the conditioning of the cell may cause the cell to be over charged and thereby cause an incorrect result when read and/or verified.

DETAILED DESCRIPTION

In the following detailed description of the present disclosure, reference is made to the accompanying drawings that form a part hereof, and in which is shown by way of illustration how various embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

The terms wafer and substrate used herein include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one of ordinary skill in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present disclosure is defined only by the appended claims and equivalents thereof.

Figure 1:
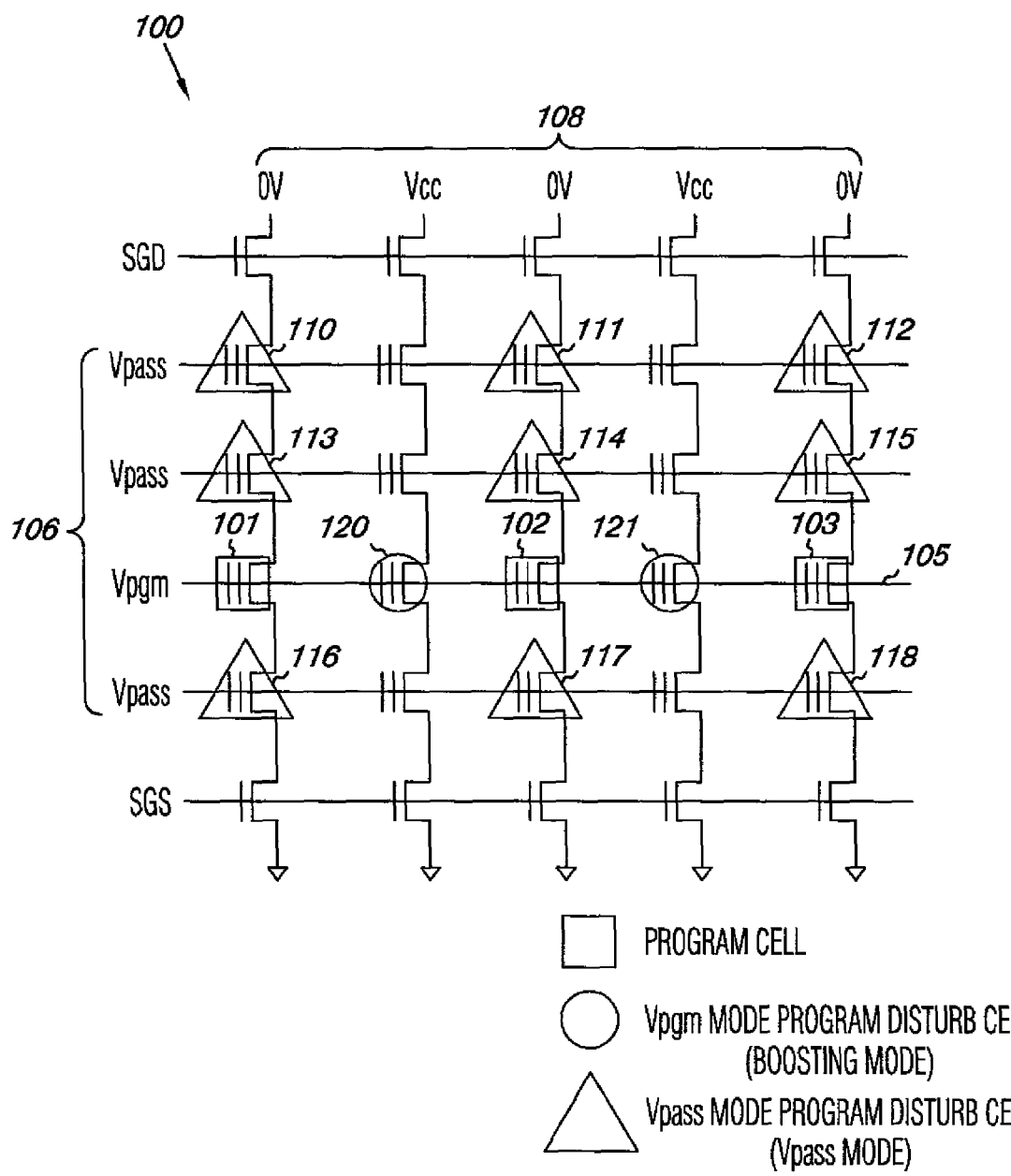
FIG. 1 is a schematic of a portion of a NAND memory array that can be used with embodiments of the present disclosure.

FIG. 1 illustrates a portion of a NAND flash memory array the can be used with various embodiments of the present disclosure. However, the embodiments of the present disclosure are not limited to use with such a memory array.

As shown in FIG. 1, the memory array 100 includes a number of word lines 106 and intersecting bit lines 108. For ease of addressing in the digital environment, the number of word lines and the number of bit lines are typically each some power of two (e.g., 256 word lines 106 by 4,096 bit lines 108).

In various devices and systems, memory array 100 can be divided into discrete blocks of cells that can be erased together. Such memory blocks may be referred to as an erase unit.

In the example in FIG. 1, the figure illustrates that the memory array 100 includes a number of cells that are being programmed 101, 102, and 103. Additionally, in the illustrated embodiment of FIG. 1, the array 100 also includes a number of Vpass mode program disturb cells 110, 111, 112, 113, 114, 115, 116, 117, and 118 and a number of Vpgm mode program disturb cells 120 and 121.

These non-volatile memory cells of each NAND string are connected in series source to drain between a source select gate (i.e., SGS), which can, for example, be a field-effect transistor (FET), and a drain select gate (e.g., SGD), which can, for example, be a FET.

During a program operation to program a number of memory cells (e.g., memory cells 101, 102, or 103), the selected word line 105, coupled to that cell or cells 101 to 103, may be supplied by a number of programming pulses. As discussed further in connection with FIGS. 2A and 2B below, in many memory arrays, these voltages can start at a voltage of around 16V and may incrementally increase, such as in a stepped fashion, to around 20V.

The bit line, coupled to cells 101 to 103, may be brought to ground potential, which can provide a gate to source potential of 20V across the cells 101 to 103 that are to be programmed. The unselected word lines (e.g., the word lines without cells to be programmed) may be biased at a pass voltage Vpass that can be around 9-10V.

The unselected cells (e.g., cells 120 and 121) on the selected word line 105 can also have the 20V programming pulse applied. In order to inhibit these cells (e.g., 120 and 121) from being programmed, their bit lines 108 may be biased to an inhibiting potential (e.g., a supply potential Vcc that can be about 3-6V, for example).

As NAND flash memory is scaled, parasitic capacitance coupling between a selected word line and adjacent word lines can become problematic. The parasitic coupling can cause neighboring cells to become prone to having their threshold voltages raised, which can result in an unprogrammed cell appearing to be programmed, for example. One type of parasitic capacitance coupling is referred to as a program disturb condition. In a program disturb condition, a programming operation for one page induces a change in bit value in another, unrelated page.

A program disturb condition typically appears in during certain operation modes. For example, in a boosting mode, the cell's channel typically has at a positive boosting voltage (e.g., 6V) with respect to the gate and the gate typically has a voltage at Vpgm (e.g., 20V). During the Vpass mode, the cell's channel is typically at ground and the gate is typically at Vpass (e.g., 10V). In either of this modes, a program disturb can arise.

In FIG. 1, the cells 120, 121 on the selected word line 105 and inhibited bit lines are influenced by boosting mode program disturb. The neighboring cells 110-118 that are coupled to the enabled bit lines experience Vpass mode program disturb.

In a positive way, program disturb is often degraded as the number of processing cycles increases. As used herein, a processing cycle can refer to a program (e.g., a write) operation and/or an erase operation that can be performed on a memory block of a memory array (e.g., array 100 shown in the embodiment of FIG. 1).

In various devices and systems, program/erase operations can be performed on memory blocks on a block by block basis, and the number of program/erase cycles performed on a memory block can be stored within memory array 100. The quantity of program/erase cycles performed on a memory block can be referred to as an "experience count," or "hot count." The hot count of a memory array, and/or of each memory block within the memory array, can be monitored by a system controller (e.g., control circuitry 712 of the embodiment shown in FIG. 7).

As the quantity of program/erase cycles increases, the voltage difference between the programmed state and the erased state narrows. This factor may help increase the performance of the memory array.

However, this factor also makes the affected cells more susceptible to over-programming as the threshold voltage, Vt, narrows. This is a result of the program disturb causing an increasing threshold voltage as the quantity of program/erase cycles increase.

Figure 2A:
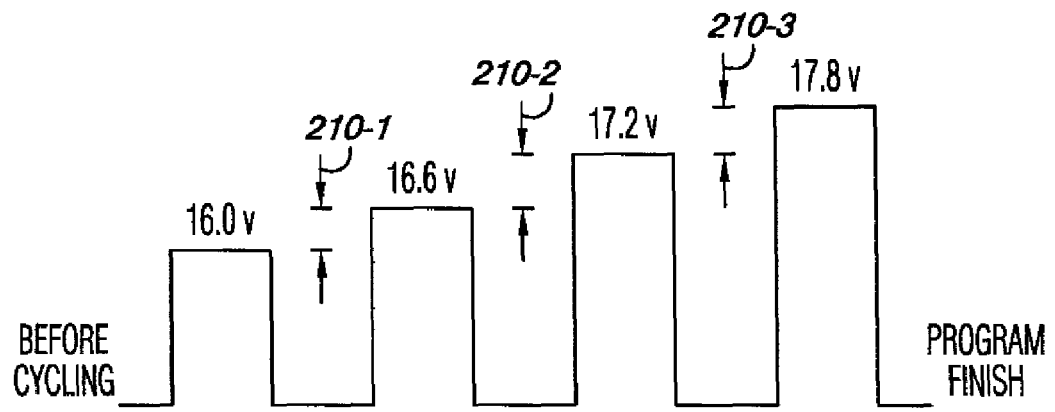
FIG. 2A illustrates a pulse technique for incrementally programming storage elements of a memory cell array before a number of cycles have occurred according to an embodiment of the present disclosure.

FIG. 2A illustrates a pulse technique for incrementally programming storage elements of a memory cell array before a number of cycles have occurred according to an embodiment of the present disclosure. The pulse technique shown in FIGS. 2A and 2B may be used with single level memory cell arrays (SLCs) and/or multiple level memory cell arrays (MLCs).

In the embodiment described by the illustration in FIG. 2A, a memory cell's programming process includes four voltage pulses (e.g., 16.0V, 16.6V, 17.2V, and 17.8V). However, embodiments of the present disclosure are neither limited to four pulses nor to a particular starting or ending pulse voltage. For example, the number of pulses and/or the starting and ending pulse voltage before a number of cycles (e.g., before a number of program/erase cycles) can depend on various factors including the type of memory cell array.

As one of ordinary skill will appreciate, and as discussed further below, verify pulses can be utilized between the program pulses depicted in FIG. 2A. Verify pulses can, for example, be positioned between the 16.0V and 16.6V pulses, etc.

The number of verify pulses between program pulses can depend on the number of states represented by the memory cell. For example, a program voltage signal used to program a four state memory cell can have three verify pulses between the program pulses which increase incrementally. For instance, a first verify pulse may be at 0.5V, a second verify pulse may be at 1.5V, and a third verify pulse may be at 3.0V.

FIG. 2A also depicts the voltage difference between pulses ("step up voltage") 210-1, 210-2, and 210-3 as being equal values of 0.6V. Embodiments of the present disclosure are not so limited (e.g., step up voltages 210-1, 210-2, and 210-3 can be different values from each other and/or greater or less than 0.6V).

Figure 2B:
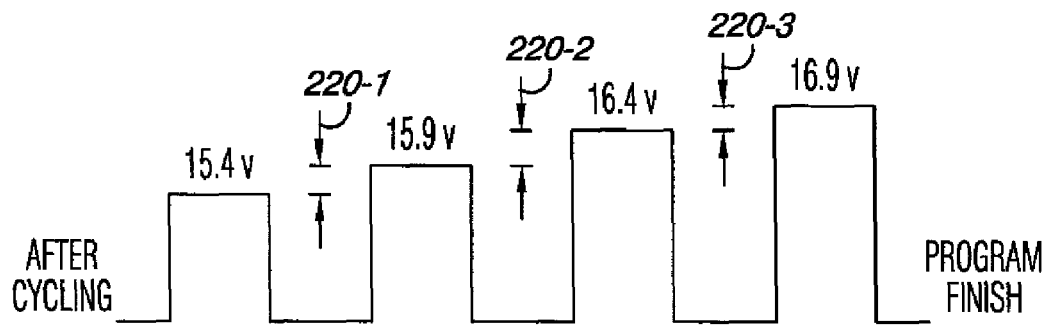
FIG. 2B illustrates a pulse technique for incrementally programming storage elements of a memory cell array after a number of cycles have occurred according to an embodiment of the present disclosure.

FIG. 2B illustrates a pulse technique for incrementally programming storage elements of a memory cell array after a number of cycles have occurred according to an embodiment of the present disclosure.

FIG. 2B includes four voltage pulses (e.g., 15.4V, 15.9V, 16.4V, and 16.9V). However, embodiments of the present disclosure are neither limited to four pulses nor to a particular starting or ending pulse voltage. For example, the number of pulses and/or the starting and ending pulse voltage after a number of processing cycles (e.g., program/erase cycles) can depend on various factors including the type of memory cell array. As one of ordinary skill will appreciate, and as discussed further below, verify pulses can also be utilized between the program pulses depicted in FIG. 2B (e.g., between the 15.4V and 15.9V pulse, etc).

FIG. 2B also depicts the voltage difference between pulses ("step up voltage") 220-1, 220-2, and 220-3 as being equal values of 0.5V. Embodiments of the present disclosure are not so limited, e.g., step up voltages 220-1, 220-2, and 220-3 can be different values from each other and/or greater or less than 0.5V.

In various embodiments of the present disclosure, the programming voltage pulses (e.g., programming voltage signal) shown in FIG. 2A can be applied to a wordline in a memory block in order to program memory cells until a number of processing cycles have occurred (e.g., until 1,000, 10,000, 50,000, 100,000, etc. program/erase cycles have occurred). Thereafter, according to various embodiments, adjusted programming voltage pulses as shown in FIG. 2B can be applied to wordlines in the memory block, for example, in order to program the memory cells.

For instance, the programming voltage signal of the embodiment represented in FIG. 2A can be applied before the quantity of processing cycles reaches a count of 10,000, and then the decreased programming voltage signals of FIG. 2B can be applied thereafter.

Embodiments of the present disclosure are not limited to the above example shown in FIGS. 2A and 2B. For instance, in various embodiments, an adjusted programming voltage signal (e.g., a signal in which the voltage pulses and/or step up voltages are decreased) may be applied after more or fewer program/erase cycles have occurred.

The embodiment shown in FIGS. 2A and 2B illustrates a decrease in programming voltage pulses of 0.6V-0.9V between the before cycling and after cycling programming voltage signals. In various embodiments, the decrease can be the same voltage for two or more of the programming voltage pulses (e.g., a 0.6V decrease for all programming voltage pulses or e.g., 0.6V for a first pulse, 0.7V for a second pulse, and 0.8V for third and fourth pulses).

In some embodiments, such as the embodiment illustrated in FIGS. 2A and 2B, the step up voltage can also be decreased after cycling (e.g., the step up voltage goes from 0.6V before cycling to 0.5V after cycling). However, in some embodiments, only the programming voltage pulses or the step up voltage may be decreased after cycling. For example, the initial programming voltage or pulses may be decreased after a number of programming cycles while the step up voltage remains constant. For instance, in some embodiments the step voltage before a number of program/erase cycles may remain at a value of 0.5V after a number of program/erase cycles, e.g., 1,000 cycles, have occurred.

Furthermore, it is possible to adjust the programming voltage signal more than one time. That is, the programming voltage signal as illustrated in FIG. 2A, for example, can be applied to wordlines in a memory block in order to program memory cells until the hot count reaches a predetermined quantity such as 1,000 counts.

In such embodiments, an adjusted programming signal (e.g., the adjusted signal illustrated in FIG. 2B) can then be applied to program memory cells in a memory block until the hot count reaches another predetermined quantity such as 10,000 counts, for example. At such a point, a second adjusted programming voltage signal can be applied to program memory cells in the memory block.

As an example, the second adjusted programming signal can, for example, contain incrementally increasing voltage pulses of 14.9V, 15.4V, 15.9V, and 16.4V, which are lower than the voltage pulses in the programming voltage signal depicted in FIG. 2B. Such multiple adjustment embodiments can allow for smaller adjustments and more flexibility in adjusting different cells in a MLC array, among other benefits.

As mentioned above, decreasing the voltage pulses and/or step up voltages after a number of processing cycles (e.g., program/erase cycles) can increase program performance by reducing the occurrence of over-programming which may be caused by electron trapping in the tunnel oxide layer of memory cells, for example.

Figure 3:
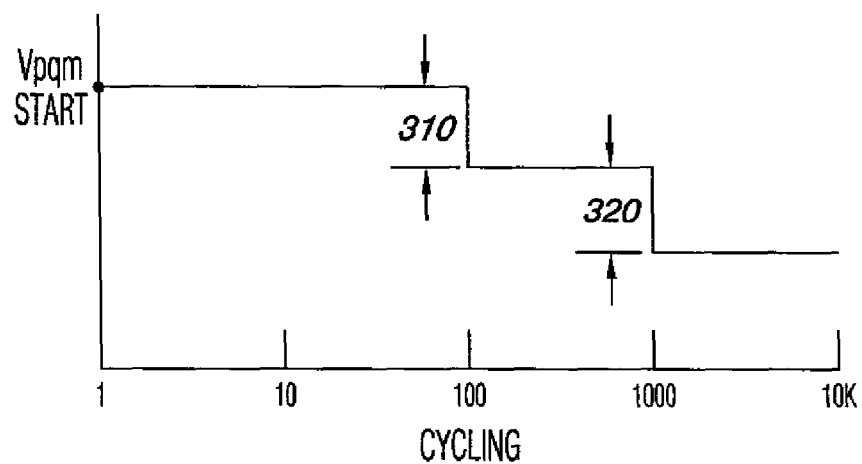
FIG. 3 illustrates a periodic decrease in the Vpgm voltage as the number of cycles increases for an embodiment of the present disclosure.

FIG. 3 illustrates a periodic decrease in the Vpgm voltage as the number of cycles increases for an embodiment of the present disclosure. The embodiment illustrated in FIG. 3 illustrates the starting program voltage (Vpgm START) as a function of the number of processing cycles (e.g., program/erase cycles) or hot count.

As used herein, Vpgm START can refer to a single voltage used for programming or to the voltage of an initial programming voltage pulse in a series of programming voltage pulses used to program memory cells in a memory block. For instance, Vpgm START for the embodiment in FIG. 2A is 16.0V and for the embodiment in FIG. 2B is 15.4V.

The embodiment illustrated in FIG. 3 depicts Vpgm START as being decreased multiple times, first, by an amount 310 after 100 cycles and, second, being further decreased by an amount 320 after 1000 cycles. As stated herein, the decrease can be any suitable amount. For example, the amounts 310 and 320 are on the order of about 0.5V and, in various embodiments, may or may not be equal amounts.

For example, the value of amounts 310 and 320 may depend on the number of cycles that have occurred therebetween. For instance, the decrease amount 320 may be greater or less than the decrease amount 310 depending on whether the Vpgm START decrease occurs after 100 cycles (as shown) or after 1,000 cycles.

It is noted that although the example embodiments illustrated in FIGS. 2A-2B and 3 depict programming voltage changes at threshold values of 100, 1,000, or 10,000 cycles, embodiments are not so limited. That is, embodiments of the present disclosure are not limited to adjusting a programming voltage after predetermined threshold hot count values (e.g., processing cycles).

Figure 4A:
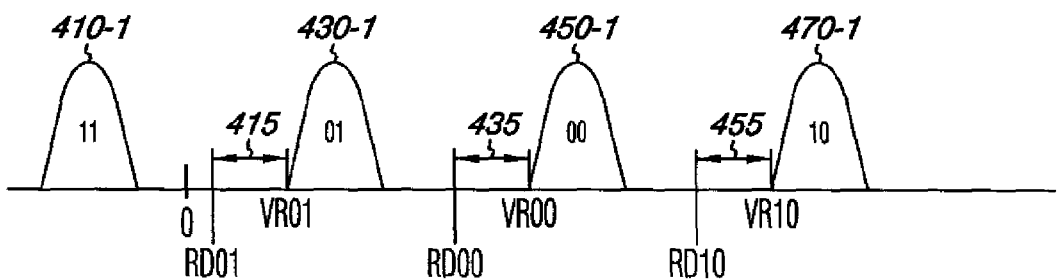
FIG. 4A illustrates a distribution of voltage thresholds of a group of non-volatile memory cells that have been individually programmed into one of four states before a number of cycles have occurred according to an embodiment of the present disclosure.

FIG. 4A illustrates a distribution of voltage thresholds (Vt) of a group of non-volatile memory cells that have been individually programmed into one of four states before a number of cycles has occurred according to an embodiment of the present disclosure. That is, the embodiment of FIG. 4A illustrates a Vt distribution of a group of cells prior to a number of program/erase cycles, e.g., 100 cycles, 1,000 cycles, etc.

Although there are many forms of memory cells having various numbers of states per memory cell, an array with four states per memory cell (e.g., a storage element) has been chosen for illustrative purposes. In such arrays, two bits of data can be stored in each memory cell.

In the embodiment represented by the illustration of FIG. 4A, the programmed storage elements form memory cell transistors with threshold levels that fall into one of threshold distributions 410-1, 430-1, 450-1, or 470-1. The distribution 410-1 represents the erased state, or erase level, and is also one of the programmed states (e.g., a "11" in FIGS. 4A and 4B). The distribution 410-1 includes cells having a negative threshold voltage Vt.

The distribution 430-1, including positive threshold voltages, represents data bits "01". Similarly, the distribution 450-1 represents "00" and the distribution 470-1 represents "10". The distributions 430-1, 450-1, and 470-1 can be referred to as a number of program levels. An additional number of states, and thus more bits, may be programmed into each storage element (e.g., embodiments are not limited to a system with one erase level and three program levels).

The individual cells are programmed by a series of pulses such as illustrated in FIGS. 2A and 2B. After a block has been erased, all of its memory cell storage transistors have threshold voltages within the distribution 410-1.

Upon programming either user data or block overhead data into a number of memory cells forming all or a portion of a block, programming voltage pulses are applied to those cells whose state is to be changed from "11" to something else. For those transistors to be programmed into the first state "01" out of erase, the pulsing is terminated when their Vt become equal to or greater than the verify level VR01, within the distribution 430-1. The states of the cells are verified in between the programming pulses.

Similarly, pulsing is terminated for those storage transistors to be programmed into the "00" state when their Vt become equal to or greater than the verify level VR00, within the distribution 450-1. Finally, for those storage element transistors being programmed into the "10" state, the program pulses are terminated when their Vt reaches their verify level VR10, within the distribution 470-1. At that point, the parallel programming of the group of the memory cells has been completed.

The individual program verify levels VR01, VR00, and VR10 are coincident with the lower extremes of their respective distributions 430-1, 450-1 and 470-1. The beginning voltage of the programming pulses of FIGS. 2A and 2B may be around 16 volts, as an example, and the increment between pulses ($\Delta$Vpgm or step up voltage) about 0.2-0.6 volts, for example. The spread of the individual distributions 410-1, 430-1, 450-1 and 470-1 may be approximately equal to $\Delta$Vpgm.

FIG. 4A also illustrates the voltages used to read data from individual cells by determining which of the four threshold states the cell has been programmed. The read voltage levels RD01, RD00, and RD10 are reference voltages used to read the "01", "00" and "10" storage states, respectively. These voltages can be positioned roughly halfway between adjacent ones of the distributions 410-1, 430-1, 450-1 and 470-1. As an example, RD01 may be about 0.1V, RD00 may be about 1.0V, and RD10 may be about 1.9V. Also, the program verify voltages VR01, VR00, and VR10 corresponding to the read voltages RD01, RD00, and RD10, respectively, may have respective voltages of about 0.2V, 1.2, and 2.2V.

These are the threshold voltages with which the threshold voltage state of each memory cell transistor being read is compared. This can be accomplished by comparing a current or voltage measured from the cell with reference currents or voltages, respectively.

Figure 5:
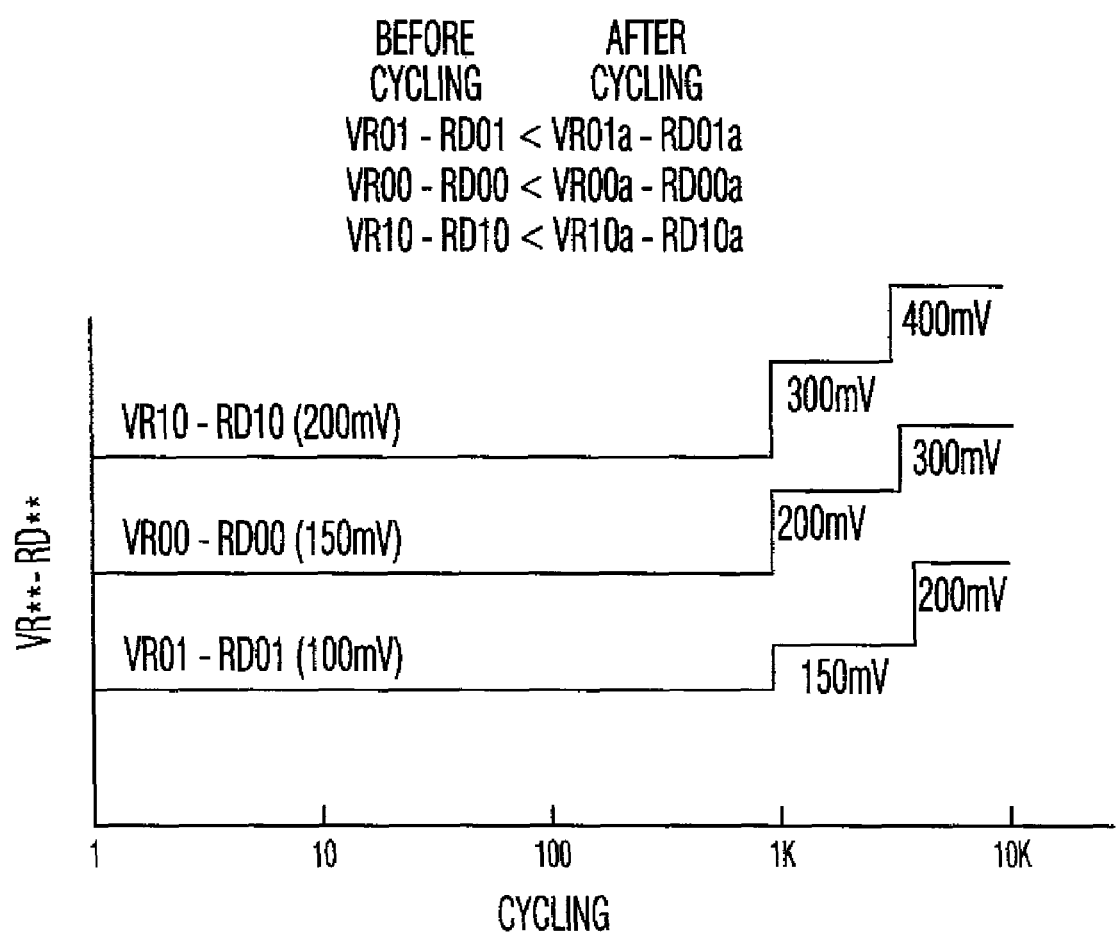
FIG. 5 illustrates verify and read voltage difference changes for a number of memory cells before and after cycling for an embodiment of the present disclosure.

As discussed further in connection with FIG. 5, FIG. 4A also depicts differences, e.g., 415, 435, and 455, between program verify levels and corresponding read levels for the states. As an example, the difference 415, e.g., VR01-RD01, can be on the order of about 0.1V-0.2V. The difference between a program verify level and a corresponding read level may be referred to herein as a read margin.

Also, as discussed in connection with FIG. 5, the difference between a verify level and a corresponding read level can be larger for higher states, e.g., the difference 435 for the "00" state may be about 0.15V and the difference 455 for the higher "10" state may be 0.2V. Embodiments of the present disclosure are not limited to these examples.

As the quantity of program/erase cycles, e.g., the "hot count," increases, data retention can be degraded due to Vt shifts. This data retention degradation can be higher in MLCs than in single level cells (SLCs) due to the need to distinguish between the multiple states within Vt ranges.

As discussed below in connection with FIGS. 4B and 5, in various embodiments of the present disclosure, data retention can be increased by increasing the difference between program verify voltages and corresponding read voltages for states as the number of process cycles (e.g., program/erase cycles) increases. In various embodiments, both the read voltages and the corresponding verify voltages can be adjusted, e.g., increased, such that the difference between the verify and read voltage increases as the hot count increases. As discussed in FIG. 6B, in some embodiments, the read voltage may not be adjusted as the hot count increases while the verify voltage is increased as the hot count increases. In various embodiments, the difference (read margin) is increased after a predetermined number of cycles, e.g., 100, 1000, 10,000, etc. In various embodiments, the read margin is increased after more than one number of cycles. For instance, in some embodiments, the read margin is increased after every 1,000 cycles.

Figure 4B:
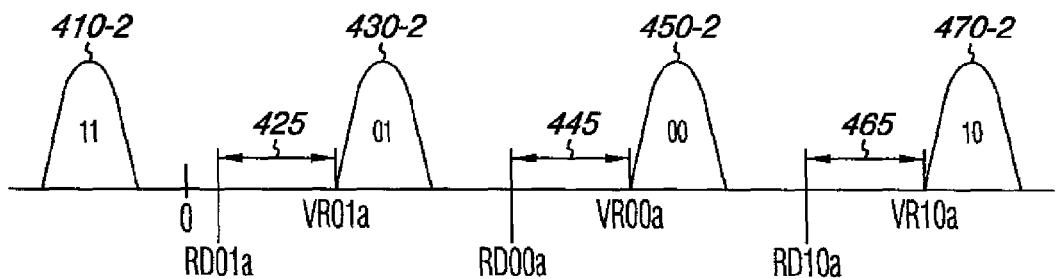
FIG. 4B illustrates a distribution of voltage thresholds of a group of non-volatile memory cells that have been individually programmed into one of four states after a number of cycles have occurred according to an embodiment of the present disclosure.

FIG. 4B illustrates a distribution of voltage thresholds (Vt) of a group of non-volatile memory cells that have been individually programmed into one of four states after a number of cycles has occurred according to an embodiment of the present disclosure. According to various embodiments of the present disclosure, FIG. 4B represents the distribution shown in FIG. 4A after a number of processing cycles, e.g., after 100, 100, or 10,000 cycles. As one of ordinary skill in the art will appreciate, the voltage threshold distributions associated with MLCs can shift as the quantity of processing cycles performed on a memory block increases. An array with four states per storage element has been chosen for illustrative purposes.

The embodiment shown in FIG. 4B illustrates MLCs having threshold levels that fall into one of threshold distributions 410-2, 430-2, 450-2 or 470-2. The distribution 410-2 represents the erased state and is also one of the programmed states, "11" in this example.

The distribution 410-2 includes cells having a negative threshold voltage Vt. The distribution 430-2, including positive threshold voltages, represents data bits "01".

Similarly, the distribution 450-2 represents "00" and the distribution 470-2 represents "10". An additional number of states, and thus more bits, may be programmed into each storage element, i.e., embodiments of the present disclosure are not limited to a four state system. Similar to the distribution of FIG. 4A, the distribution of FIG. 413 includes read voltage levels RD01a, RD00a, and RD10a corresponding to the "01," "00," and "10" states, respectively. FIG. 4B also includes the corresponding verify levels VR01a, VR00a, and VR10a. FIG. 4B also depicts differences (read margins), e.g., 425, 445, and 465, between program verify levels and corresponding read levels for the states.

As discussed further below, according to various embodiments of the present disclosure, the differences 425, 445, and 465 shown in FIG. 4B are greater than the differences 415, 435, and 455 shown in FIG. 4A. That is, an initial voltage difference, e.g., difference 415 (before cycling), can be adjusted to an increased difference, e.g., difference 425 (after cycling) in order to improve data retention in a memory block.

Also as shown in the embodiment of FIGS. 4A and 4B and discussed further below, the read voltages and verify voltages after cycling (e.g., RD01a, RD00a, RD10a, VR01a, VR00a, and VR 10a) can be increased such that they are higher than the corresponding voltage levels (e.g., RD01, RD00, RD 10, VR01, VR00, and VR10) prior to cycling. For example, as shown in FIGS. 4A and 4B, RD00a is greater than RD00 and RD10a is greater than RD 10.

As discussed herein, various method embodiments of the present disclosure include counting a number of process cycles performed on a first memory block in a memory device. Various method embodiments include adjusting a difference between a program verify voltage and a read voltage associated with the number of process cycles, from an initial voltage difference, in response to the counted number of process cycles.

In various embodiments, adjusting the voltage difference between the program verify voltage and the read voltage includes increasing the voltage difference. The voltage difference between the program verify voltage and the read voltage can be increased from an initial value by about 100 mV. In various embodiments, the initial voltage difference is in the range of 100-200 mV. In various embodiments, the voltage difference is increased periodically when the number of process cycles performed on the memory block increases past one or more process cycle count thresholds.

In various embodiments, the initial read voltage, e.g., the read voltage prior to a number of process cycles, is increased based upon the quantity of process cycles. For example, RD00 may be increased from an initial value of about 0.9V to about 1.0V after 1,000 cycles have occurred.

FIG. 5 illustrates verify and read voltage difference changes for a number of memory cells before and after cycling for an embodiment of the present disclosure. The embodiment illustrated in FIG. 5 shows the voltage difference between a program verify voltage and a read voltage associated with the three program states (01, 00, and 10) for a four state MLC as discussed above. Embodiments of the present disclosure are applicable to single level cell (SLC) memory arrays as well.

As illustrated in FIG. 5, the difference between a program verify voltage level and a read voltage level can be adjusted for a given state after a number of program/erase cycles. For instance, in the embodiment of FIG. 5, the initial 100 mV difference (VR01-RD01) is increased to a 150 mV difference after 1,000 (1K) cycles. Similarly, the initial 150 mV difference (VR00-RD00) is increased to a 200 mV difference after 1,000 cycles, and the initial 200 mV difference (VR10-RD10) is increased to a 300 mV difference after 1,000 cycles.

Also as illustrated in the embodiment of FIG. 5, the initial voltage difference between a verify voltage and a read voltage, e.g., the difference before a number of program/erase cycles have been performed on the memory array, can be greater for higher states, or higher program levels, That is, as shown in FIG. 5, the lowest level (01) has an initial difference of 100 mV, while the higher levels (00, and 10) have initial differences of 150 mV and 200 mV, respectively.

After cycling, e.g., after a number of program/erase cycles have been performed on the memory block, the voltage differences associated with the program levels may be adjusted by different voltage amounts. In various embodiments, the voltage difference associated with a higher program level is increased by a greater amount than the voltage difference associated with a lower state. For example, as shown in the embodiment of FIG. 5, after 1,000 cycles, the voltage difference associated with the "00" level increases by 50 mV (from 150 mV to 200 mV) while the voltage difference associated with the "10" level increases by 100 mV (from 200 mV to 300 mV).

As shown in FIG. 5, in various embodiments, the voltage difference between a program verify level and a read level can be adjusted based on the quantity of cycle counts. The voltage difference may be adjusted a number of times. For example, as shown in FIG. 5, the voltage differences for all three program levels depicted are increased when the quantity of cycle counts reaches 1,000 and again when the quantity of cycle counts reaches about 5,000, in this example. In various embodiments, the read voltage and/or the verify voltage associated with a state can be adjusted, e.g., increased, based on the quantity of cycle counts.

It is also noted that in some embodiments, the voltage difference changes before and after cycling may occur after differing numbers of cycle counts for different states. For instance, VR01-RD01 may be increased when 100 processing cycles have occurred, while VR00-RD00 may be increased when 1,000 processing cycles have occurred and VR10-RD10 may by increased when 500 cycles have occurred. Embodiments of the present disclosure are not limited to these examples.

Figure 6A:
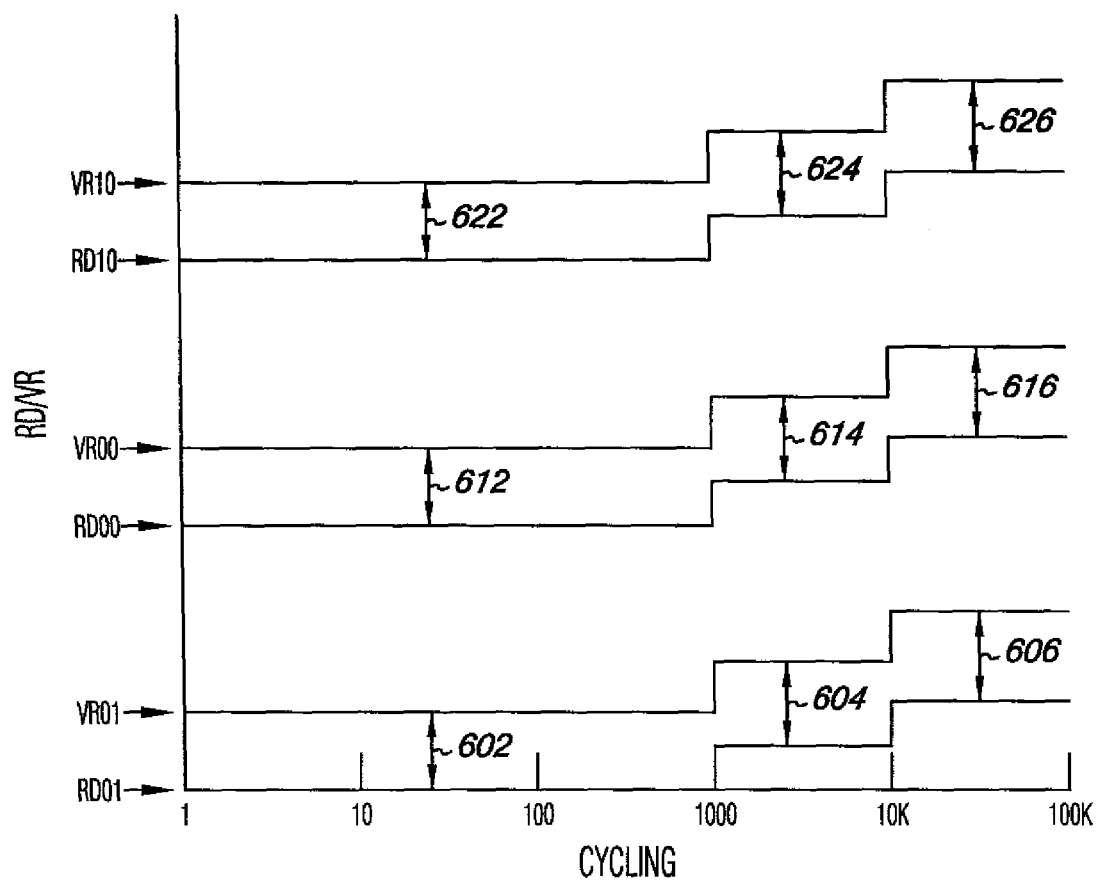
FIG. 6A illustrates verify and read voltages for a number of memory cells as the number of cycles increases according to an embodiment of the present disclosure.
Figure 6B:
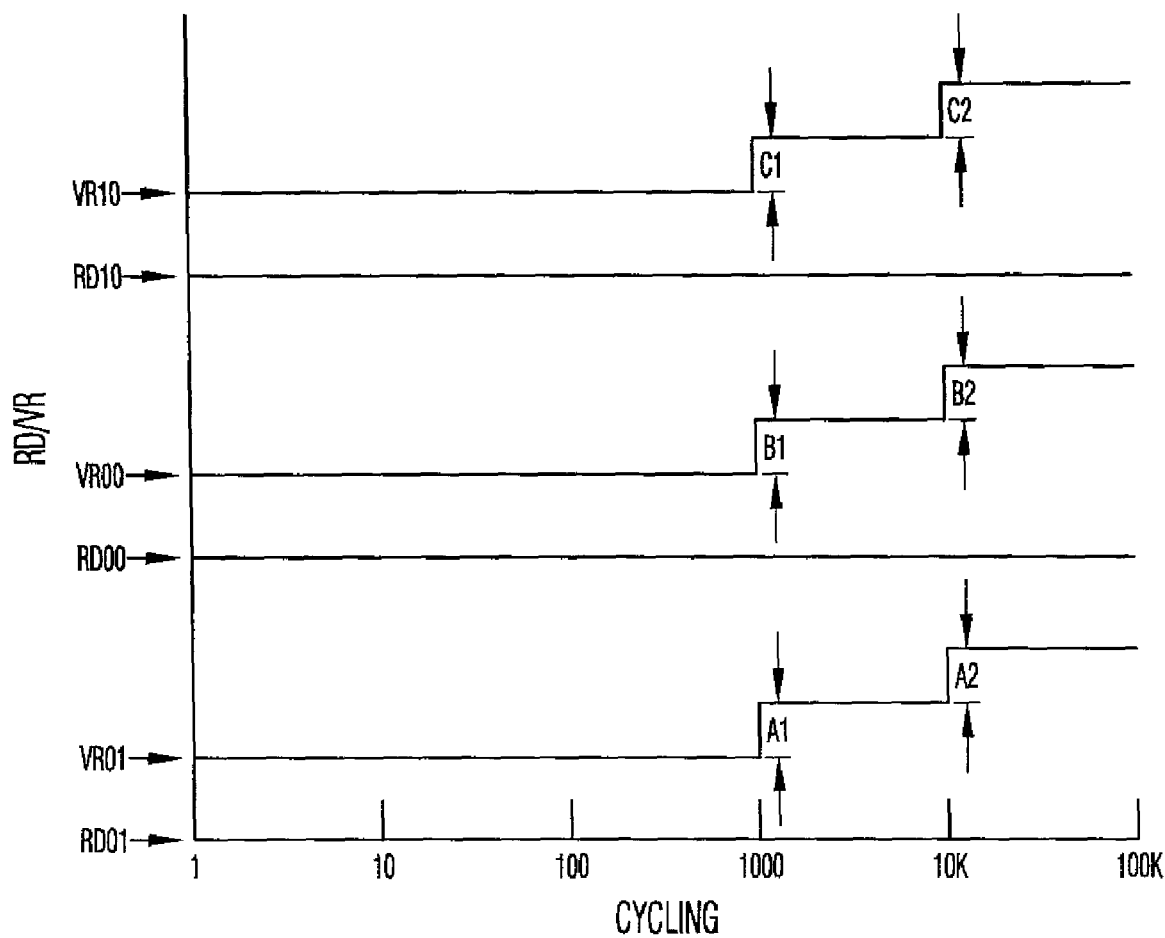
FIG. 6B illustrates verify and read voltages for a number of memory cells as the number of cycles increases according to an embodiment of the present disclosure.

FIGS. 6A and 6B illustrate verify and read voltages for a number of memory cells as the number of cycles increases according to various embodiments of the present disclosure. The embodiments of FIGS. 6A and 6B illustrate the read voltages and program verify voltages for three program states (01, 00, and 10) of a four state MLC.

The embodiment illustrated in FIG. 6A shows various voltage differences that can be adjusted according to various embodiments of the present disclosure. In various embodiments, one or both of a read voltage and verify voltage corresponding to a given state can be increased based on the number of program/erase cycles. For example, in this embodiment, the read voltages RD01, RD00, and RD10 and the verify voltages VR01, VR00, and VR10 are each increased after the cycle count reaches 1,000 and again when the cycle count reaches 10,000.

The embodiment illustrated in FIG. 6A shows the voltage difference between the verify and read voltages for the three program states prior to the cycle count reaching 1,000 counts, after reaching 1,000 counts, and after reaching 10,000 counts. As shown, voltage differences 602, 612, and 622 represent the verify/read voltage differences prior to the hot count reaching 1,000 for the 01, 00, and 10 states, respectively. Similarly, voltage differences 604, 614, and 624 represent the verify/ read voltage differences after the hot count reaches 1,000 for the 01, 00, and 10 states, respectively. The voltage differences 606, 616, and 626 represent the verify/read voltage differences after the hot count reaches 10,000 counts for the 01, 00, and 10 states, respectively.

In various embodiments, the verify/read voltage differences for each state are increased as the hot count increases.

As an example, for the 00 program state, the difference 612 can be 0.2V, the difference 614 can be 0.4V, and the difference 616 can be 0.5V. As previously mentioned, in various embodiments, the verify/read voltage differences are made larger for higher program states. For instance, in this example, for the 10 state, the difference 622 can be 0.4V, the difference 624 can be 0.5V, and the difference 626 can be 0.6V.

In is noted that FIG. 6A is not drawn to scale. That is, although it appears that the read voltages and verify voltages for the various states are increasing by equal amounts, embodiments are not so limited. For example, RD00 can be increased from 0.9V to 1.0V after 1,000 cycles and from 1.0V to 1.15V after 10,000.

According to the embodiment illustrated in FIG. 6B, the read voltage associated with each program state of the MLC (01, 00, and 10) does not change as the cycle count increases. However, in various embodiments, the program verify voltage associated with the program states can be adjusted, e.g., increased, at particular cycle count thresholds, thereby increasing the difference between the verify level and the read level. For instance, as shown in FIG. 68, the program verify levels are increased when the cycle count reaches 1,000 counts and again when the cycle count reaches 10,000 counts.

The amount of the program verify level increase when the count reaches 1,000 (A1, B1, and C1) for each program state (01, 00, and 10), respectively, may or may not be equal. Similarly, the amount of the program verify level increase when the count reaches 10,000 (A2, B2, and C2) for each program. state (01, 00, and 0), respectively, may or may not be equal to each other and/or may or may not be equal to the amount of the prior increase (A1, B1, and C1).

In some embodiments, the read voltage for one or more program state 01, 00, and 10, may remain constant as the cycle count increases while the read voltage for the other states increases as the cycle count increases. For example, in some embodiments, RD01 may remain constant as the cycle count increases, while RD00, and RD10 are increased as the cycle count increases.

Figure 7:
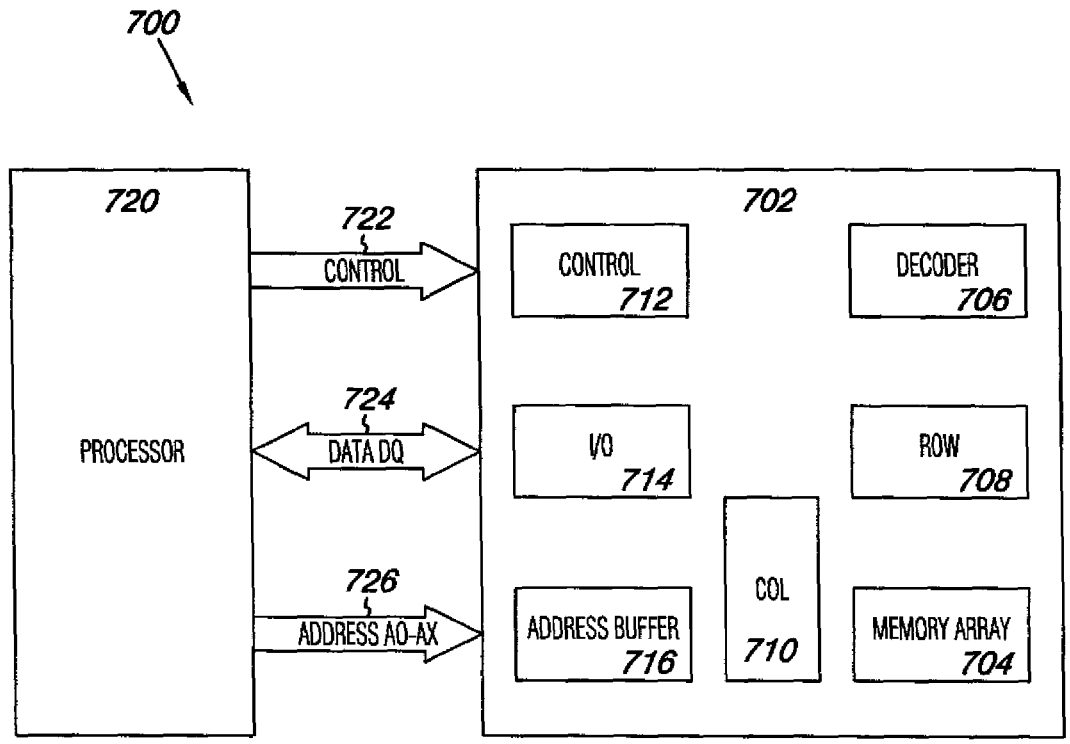
FIG. 7 is a functional block diagram of an electronic system having at least one memory device in accordance with an embodiment of the present disclosure.

FIG. 7 is a simplified block diagram of an electronic system 700, according to an embodiment of the present disclosure. Electronic system 700 includes a non-volatile memory device 702 that includes an array 704 of non-volatile memory cells, an address decoder 706, row access circuitry 708, column access circuitry 710, control circuitry 712, Input/Output (I/O) circuitry 714, and an address buffer 716.

The array 704 of non-volatile memory cells has a NAND architecture in accordance with an embodiment of the disclosure. The memory cells (not shown in FIG. 7) of the array 704 of non-volatile memory cells may be floating-gate memory cells, NROM cells or other type of one-transistor non-volatile memory cells.

Electronic system 700 includes an external processor 720, e.g., a memory controller or host processor, electrically connected to memory device 702 for memory accessing. The memory device 702 receives control signals from the processor 720 over a control link 722. The memory cells are used to store data that are accessed via a data (DQ) link 724.

Address signals are received via an address link 726 that are decoded at address decoder 706 to access the memory array 704. Address buffer circuit 716 latches the address signals. The memory cells are accessed in response to the control signals and the address signals.

The control link 722, data link 724 and address link 726 can be collectively referred to as access lines. It will be appreciated by those skilled in the art that additional circuitry and control signals can be provided, and that the memory device detail of FIG. 7 has been reduced to facilitate ease of illustration.

Figure 8:
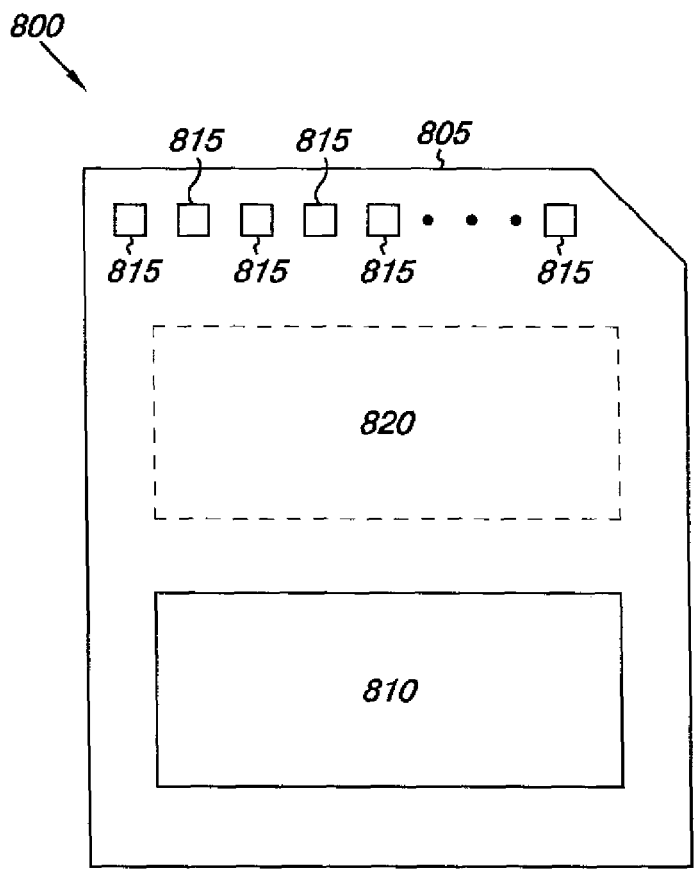
FIG. 8 is a functional block diagram of a memory module having at least one memory device in accordance with an embodiment of the present disclosure.

FIG. 8 is an illustration of an exemplary memory module 800. Memory module 800 is illustrated as a memory card, although the concepts discussed with reference to memory module 800 are applicable to other types of removable or portable memory, e.g., USB flash drives, and are intended to be within the scope of "memory module" as used herein. In addition, although one example form factor is depicted in FIG. 8, these concepts are applicable to other form factors as well.

In some embodiments, memory module 800 will include a housing 805 (as depicted) to enclose one or more memory devices 810, though such a housing is not essential to all devices or device applications. At least one memory device 810 is a non-volatile memory having NAND architecture in accordance with an embodiment of the present disclosure.

Where present, the housing 805 includes one or more contacts 815 for communication with a host device. Examples of host devices include digital cameras, digital recording and playback devices, PDAs, personal computers, memory card readers, interface hubs and the like.

For some embodiments, the contacts 815 are in the form of a standardized interface. For example, with a USB flash drive, the contacts 815 might be in the form of a USB Type-A male connector.

For some embodiments, the contacts 815 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 815 provide an interface for passing control, address and/or data signals between the memory module 800 and a host having compatible receptors for the contacts 815.

The memory module 800 may optionally include additional circuitry 820 which may be one or more integrated circuits and/or discrete components. For some embodiments, the additional circuitry 820 may include a memory controller for controlling access across multiple memory devices 810 and/or for providing a translation layer between an external host and a memory device 810. For example, there may not be a one-to-one correspondence between the number of contacts 815 and a number of 810 connections to the one or more memory devices 810.

Thus, a memory controller could selectively couple an I/O connection (not shown in FIG. 8) of a memory device 810 to receive the appropriate signal at the appropriate I/O connection at the appropriate time or to provide the appropriate signal at the appropriate contact 815 at the appropriate time. Similarly, the communication protocol between a host and the memory module 800 may be different than what is required for access of a memory device 810.

A memory controller could then translate the command sequences received from a host into the appropriate command sequences to achieve the desired access to the memory device 810. Such translation may further include changes in signal voltage levels in addition to command sequences.

The additional circuitry 820 may further include functionality unrelated to control of a memory device 810 such as logic functions as might be performed by an application specific integrated circuit (ASIC). Also, the additional circuitry 820 may include circuitry to restrict read or write access to the memory module 800, such as password protection, biometrics or the like. The additional circuitry 820 may include circuitry to indicate a status of the memory module 800.

For example, the additional circuitry 820 may include functionality to determine whether power is being supplied to the memory module 800 and whether the memory module 800 is currently being accessed, and to display an indication of its status, such as a solid light while powered and a flashing light while being accessed. The additional circuitry 820 may further include passive devices, such as decoupling capacitors to help regulate power requirements within the memory module 800.

CONCLUSION

Methods, devices, systems, and modules embodiments for memory cycle voltage adjustment have been described. Adjusting a program voltage from an initial voltage to an adjusted voltage as a counted number of processing cycles increases can maintain programming reliability as programming speed increases. Also, adjusting a difference between a program verify voltage and a read voltage as the counted number of processing cycles increases can improve data retention while maintaining fast programming speeds.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure, This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method comprising;
   determining a quantity of process cycles performed on a group of memory cells; and
   adjusting a difference between a program verify voltage and a read voltage associated with the group, from an initial voltage difference, responsive to the determined quantity of process cycles.

2. The method of claim 1, wherein adjusting a difference between a program verify voltage and a read voltage includes increasing the difference from the initial voltage difference as the quantity of process cycles performed on the group increases.

3. The method of claim 1, wherein adjusting includes adjusting the read voltage from an initial read voltage value responsive to the determined quantity of process cycles.

4. The method of claim 3, wherein adjusting further includes also adjusting the program verify voltage from an initial program verify voltage responsive to the determined quantity.

5. The method of claim 1, wherein determining a quantity includes counting a number.

6. The method of claim 1, wherein the group of memory cells includes a block of memory cells in a memory device.

7. The method of claim 1, wherein adjusting includes increasing the difference from the initial voltage difference periodically as the quantity of process cycles performed on the group increases past a threshold quantity.

8. The method of claim 1, wherein adjusting includes only adjusting the program verify voltage from an initial program verify voltage responsive to the determined quantity.

9. The method of claim 1, wherein adjusting a difference between a program verify voltage and a read voltage comprises adjusting a first difference and a second difference, wherein the first difference is between a program verify voltage and a read voltage associated with a first state of the memory cells, and wherein the second difference is between a program verify voltage and a read voltage associated with a second state of the memory cells.

10. The method of claim 9, wherein adjusting a first difference and a second difference includes adjusting the first difference by a different amount than the second difference.

11. The method of claim 9, wherein the second state is associated with a higher program level than the first state, and wherein the second difference is larger than the first difference.

12. The method of claim 9, wherein adjusting a first difference and a second difference comprises adjusting the first difference responsive to a first quantity of process cycles and adjusting the second difference responsive to a second quantity of process cycles, wherein the first quantity is different than the second quantity.

13. The method of claim 1, wherein adjusting a difference between a program verify voltage and a read voltage comprises adjusting a difference between a program verify voltage associated with a particular state of the memory cells, and a read voltage associated with the particular state of the memory cells.

14. The method of claim 1, wherein adjusting a difference between a program verify voltage and a read voltage comprises keeping the program verify constant while adjusting the read voltage.

15. The method of claim 1, wherein adjusting a difference between a program verify voltage and a read voltage comprises keeping the read voltage constant while adjusting the program verify voltage.

16. The method of claim 1, wherein adjusting a difference between a program verify voltage and a read voltage includes increasing the difference from the initial voltage difference periodically as the number of process cycles for the memory block increases past a number of process cycle count thresholds.

17. A method comprising;
   counting a number of process cycles performed on a memory block in a memory device; and
   adjusting a difference between a program verify voltage and a read voltage from an initial voltage difference responsive to the counted number of process cycles,
   wherein counting a number of processing cycles performed on a memory block includes counting a number of program/erase cycles performed on the memory block, and wherein the memory device includes a memory array comprising a plurality of memory blocks, each memory block having a plurality of memory cells arranged in rows.

18. A method comprising;

determining a quantity of processing cycles performed on a memory block in a memory device having a memory array comprising a plurality of memory blocks, each memory block having a plurality of multiple level memory cells (MLCs) arranged in rows, and each MLC capable of being programmed to an erased level and capable of being programmed to at least a first program level and a second program level, the second program level being higher than the first; and adjusting a difference between a program verify voltage and a corresponding read voltage associated with at least one of the first program level and second program level of at least one of the plurality of MLCs, from an initial voltage difference, responsive to the determined number of cycles, wherein each of the program levels has a different program verify voltage and read voltage associated therewith, and wherein adjusting a difference between a program verify voltage and a corresponding read voltage includes adjusting the difference between the program verify voltage and corresponding read voltage associated with each one of the program levels, from an initial voltage difference, responsive to the determined number of cycles.

19. A memory device comprising;

an array of memory cells; and control circuitry coupled to the array and configured to:
   determine a quantity of process cycles performed on a group of memory cells; and
   adjust a difference between a program verify voltage and a read voltage associated with the group, from an initial voltage difference, responsive to the determined quantity of process cycles.

20. The device of claim 19, wherein the control circuitry is configured to increase the difference from the initial voltage difference as the quantity of process cycles performed on the group of memory cells increases.

21. The device of claim 19, wherein the control circuitry is configured to adjust both the read voltage and the program verify voltage from an initial value responsive to the determined quantity of process cycles.

22. The device of claim 19, wherein the group of memory cells includes a block of memory cells in a memory device.

23. The device of claim 19, wherein the control circuitry is configured to adjust a first difference and a second difference, wherein the first difference is between a program verify voltage and a read voltage associated with a first state of the memory cells, and wherein the second difference is between a program verify voltage and a read voltage associated with a second state of the memory cells.

24. The device of claim 23, wherein the control circuitry is configured to adjust the first difference by a different amount than the second difference.

25. The device of claim 23, wherein the second state is associated with a higher program level than the first state, and wherein the second difference is larger than the first difference.

26. The device of claim 23, wherein the control circuitry is configured to adjust the first difference responsive to a first quantity of process cycles and adjust the second difference responsive to a second quantity of process cycles, wherein the first quantity is different than the second quantity.

27. The device of claim 19, wherein the memory device is a NAND flash memory device, and wherein the array comprises multiple level memory cells (MLCs).

* * * * *